United States Patent
Iyer et al.

(10) Patent No.: US 6,285,239 B1
(45) Date of Patent: Sep. 4, 2001

(54) FEED-FORWARD BIASING FOR RF AMPLIFIERS

(75) Inventors: Nathan R. Iyer, Greensboro; Michael R Kay, Summerfield, both of NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 09/609,510

(22) Filed: Jul. 3, 2000

Related U.S. Application Data

(63) Continuation of application No. 09/277,890, filed on Mar. 29, 1999, now Pat. No. 6,130,579.

(51) Int. Cl.[7] .................................................. G05F 1/10
(52) U.S. Cl. ........................ 327/531; 330/133; 330/285
(58) Field of Search .................................. 330/133, 134, 330/136, 285; 327/530, 306, 531

(56) References Cited

U.S. PATENT DOCUMENTS

| | | | |
|---|---|---|---|
| 2,930,987 | 3/1960 | Groce et al. | 330/136 |
| 3,158,818 | 11/1964 | Plumpe | 330/29 |
| 4,188,587 | 2/1980 | Palmer | 330/136 |
| 4,377,788 | 3/1983 | Christopher et al. | 330/136 |
| 5,432,473 | 7/1995 | Mattila et al. | 330/133 |
| 5,483,198 | 1/1996 | Nunn | 330/279 |
| 5,493,255 | 2/1996 | Murtojarvi | 330/296 |
| 5,517,684 | 5/1996 | Fujita et al. | 455/234.2 |
| 5,559,471 | 9/1996 | Black | 330/277 |
| 5,570,065 | * 10/1996 | Eberhardt et al. | 330/296 |
| 5,578,961 | 11/1996 | Fajen et al. | 327/543 |
| 5,670,911 | 9/1997 | Hori et al. | 330/277 |
| 5,703,424 | 12/1997 | Dorman | 310/90.5 |
| 5,710,519 | 1/1998 | McCalpin et al. | 327/538 |
| 5,923,215 | 7/1999 | Hans | 330/149 |
| 5,955,921 | 9/1999 | Ide et al. | 330/254 |
| 6,130,579 | * 10/2000 | Iyer et al. | 330/285 |

OTHER PUBLICATIONS

Francois Hebert, et al., "Improving Wireless Amplifier Performance with BiASIC Technology" article, Applied Microwave & Wireless Jul./Aug. 1998, pp. 74, 76,78, and 79.

Motorola website printout; PMOS Transistor, Nov. 19, 1998.

* cited by examiner

*Primary Examiner*—Jung Ho Kim
(74) *Attorney, Agent, or Firm*—Withrow & Terranova, P.L.L.C.

(57) ABSTRACT

Bias circuitry is configured to adjust bias current to one or more power amplifier stages based upon the level of the RF signal to be amplified. A feed-forward circuit senses the input power level of the signal to be amplified and dynamically adjusts the bias current for one or more amplifiers in the amplification path to ensure each amplifier is operating in a linear region for the given signal level. For amplifier configurations having multiple amplification stages, the bias circuitry provides proportional bias currents to each stage as necessary for the progressively increasing signal levels being amplified. The bias circuitry eliminates excessive quiescent bias currents that prior biasing techniques required to ensure linear operation by automatically increasing bias currents only as needed based on the effective magnitude of the RF signal to be amplified.

25 Claims, 5 Drawing Sheets

FEED-FORWARD BIASING FOR RF AMPLIFIERS

This application is a continuation of U.S. application Ser. No. 09/277,890, filed Mar. 29, 1999, U.S. Pat. No. 6,130, 579.

FIELD OF THE INVENTION

The invention relates in general to a bias circuit and, in particular, to a dynamically controllable bias circuit for radio frequency (RF) power amplifiers.

BACKGROUND OF THE INVENTION

Radio frequency power amplifiers are used in numerous wireless communication applications. Many of these applications are in the field of consumer electronics, which are portable and require batteries. Although battery technology has advanced significantly in recent years, battery powered communication devices require maximum power efficiency for transmission of RF signals while using as little energy as possible.

Current wireless systems have increasing power amplifier linearity requirements to minimize adjacent and alternate channel distortion. A commonly applied technique to improve the linearity of RF power amplifiers is to increase their quiescent current so that the transistors forming the amplifier operate in a more linear portion of the current-to-voltage (i/v) curve. Unfortunately, increasing the quiescent current of the amplifier requires the amplifier to constantly operate at a high idle current even when small input signals do not demand the same linearity as larger inputs. Thus, there is a need for a bias current control technique that automatically adjusts bias currents based on the effective magnitude of the input signal being amplified to meet linearity requirements as well as maximize operating efficiency.

SUMMARY OF THE INVENTION

The present invention fulfills this need by providing bias circuitry configured to adjust bias current to one or more power amplifier stages based upon the level of the input signal. A feed-forward circuit senses the input power level of the input signal and dynamically adjusts the bias current for one or more amplifiers in the amplification path to ensure each amplifier is operating in a linear region for the given signal level. For amplifier configurations having multiple amplification stages, the bias circuitry provides proportional bias currents to each stage as necessary for the progressively increasing signal levels. The bias circuitry automatically increases bias currents only as needed to eliminate excessive quiescent bias currents that prior biasing techniques required to ensure linear operation.

The bias circuitry may be constructed using traditional bipolar and BiCMOS technology while the power amplifier may incorporate gallium arsenide (GaAs) heterojunction bipolar transistor (HBT) or MESFET technology, as well as traditional silicon-based technology. The GaAs HBT and MESFET technology allows for the design of very efficient amplifier circuitry, but is very expensive and often sensitive to temperature and the manufacturing process. Preferably, the biasing circuitry incorporates the more traditional bipolar and BiCMOS technology, which is inexpensive, easy to manufacture, and stable over temperature variations, while the amplifier circuitry incorporates the more expensive and efficient semiconductor technologies. Although the amplification circuitry may include traditional silicon-based technologies, the present invention allows implementation of different technologies in a single chip set to provide improved performance at a relatively low cost.

These and other aspects of the present invention will become apparent to those skilled in the art after reading the following description of the preferred embodiments when considered with the drawings.

BRIEF DESCRIPTION OF THE DRAWING FIGURES

DETAILED DESCRIPTION OF THE INVENTION

Figure 1:
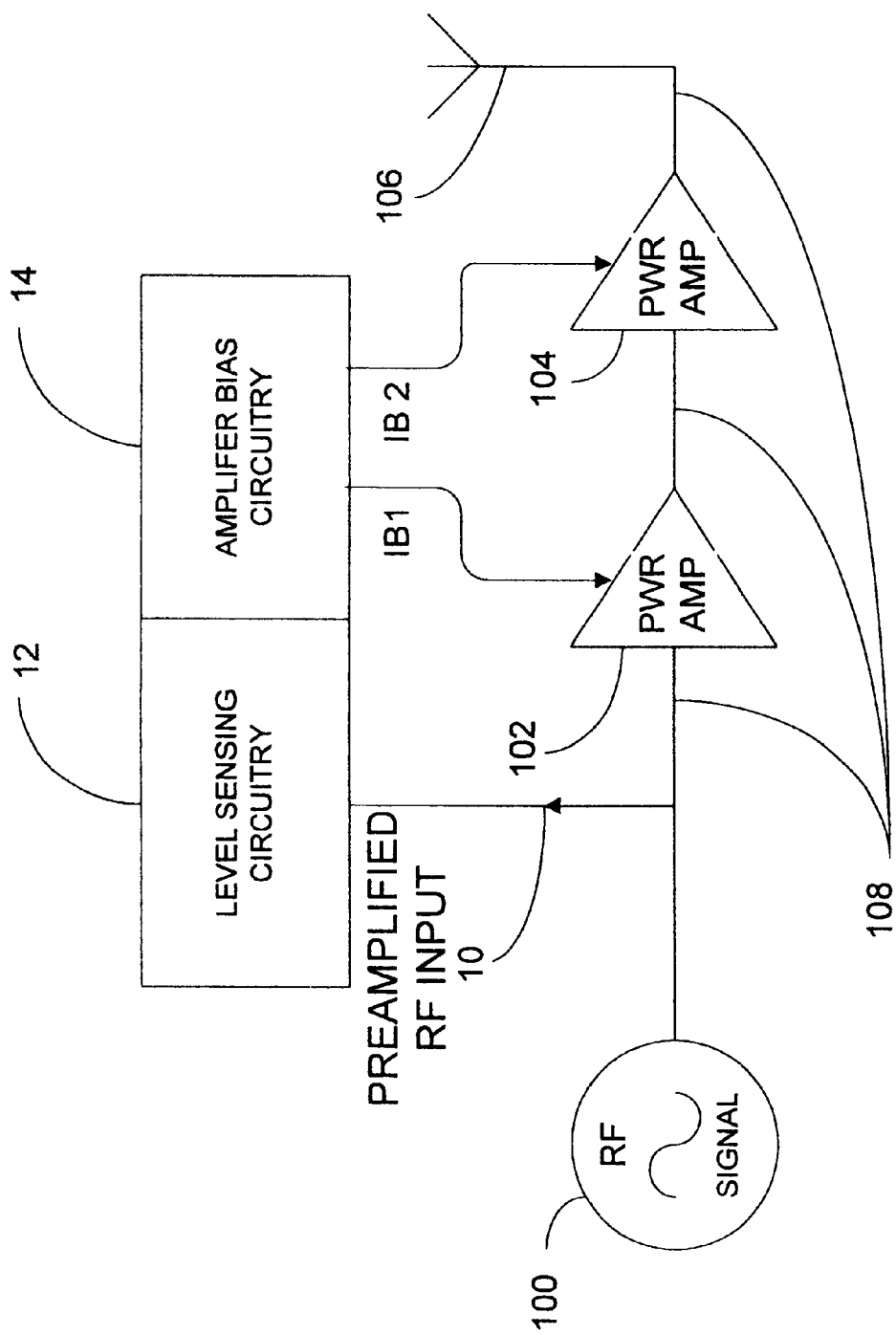
FIG. 1 is a block schematic providing a general overview of the biasing circuit of the present invention operating in conjunction with a multi-stage radio frequency power amplifier.

In the following description, like reference characters designate like or corresponding elements throughout the several views.

Figure 2:
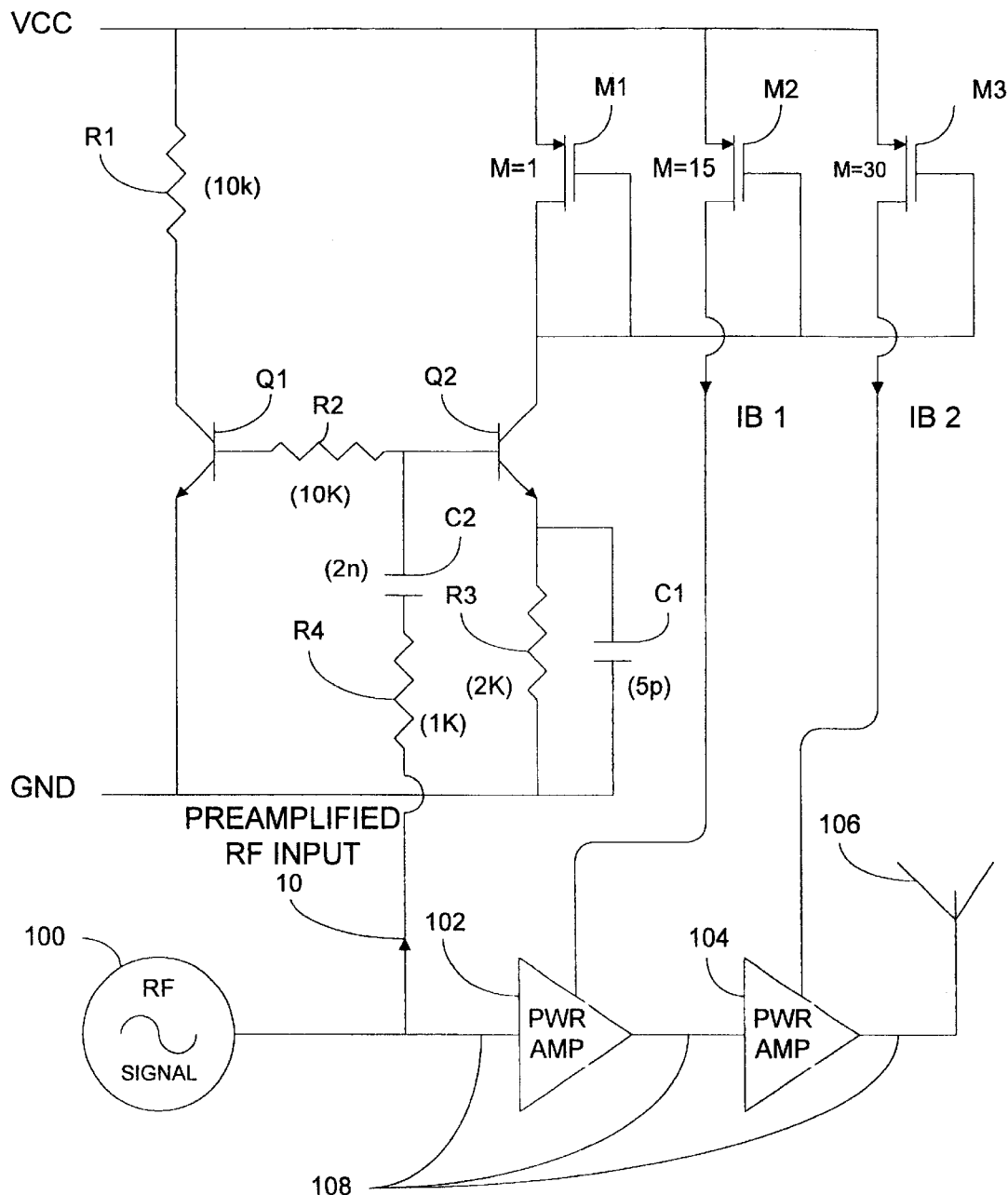
FIG. 2 is a more detailed schematic of the preferred embodiment of the biasing circuitry of the present invention as configured for a multi-stage power amplifier.

Referring now to the drawings in general, and FIGS. 1 and 2 in particular, it should be understood that the illustrations are for the purpose of describing a preferred embodiment of the invention and are not intended to limit the invention thereto. The schematics are simplified in order to promote understanding of the present invention. Those of ordinary skill in the art will be able to implement the designs based on the simplified schematics. Furthermore, the bias circuitry may include components not shown in the schematics, and like the power amplifier circuitry, all components in the circuitry may be embodied within an integrated circuit substrate. For example, although not depicted, the power amplifier circuitry as well as the bias circuitry discussed herein may include any number of active diodes, capacitors and resistors in the final design. The bias circuitry and power amplifiers discussed herein are particularly suited for wireless communication applications, but other applications will be readily apparent to those of skill in the art.

As best seen in FIG. 1, an RF signal 100 is generated in a wireless communications device for transmission. The RF signal is amplified, sequentially by first and second power amplifier stages 102, 104 and transmitted via antenna 106. The signal path along which the RF signal travels for amplification and transmission is generally referred to as the amplification path 108. The power amplifier stages 102 and 104 are transistor based, and preferably incorporate GaAs HBT or MESFET technology; however, traditional silicon-based amplifiers benefit from the present invention as well.

An RF input 10 couples a portion of the amplification path to level sensing circuitry 12 prior to any amplifier or amplification stage. The level sensing circuitry 12 senses the effective level or magnitude of the preamplified RF signal and provides dynamic control to the amplifier bias circuitry 14. According to the level of the RF signal to be amplified, the amplifier bias circuitry 14 provides a first bias current IB 1 to the first power amplifier stage 102 and a second bias current IB 2 to the second power amplifier stage 104. The bias currents IB 1 and IB 2 are automatically adjusted based on the preamplified RF signal. Because subsequent power amplifier stages, such as stage 104, operate over larger signal level ranges than preceding stages, such as stage 102, bias currents must be increased as necessary for each succeeding stage in the amplification path 108.

With reference now to FIG. 2, a more detailed schematic of the preferred embodiment of the invention is shown. Although the amplification circuitry and bias circuitry may be configured to operate at virtually any radio frequency, this particular embodiment is configured to operate between 1800 and 1900 MHz. In a preferred embodiment, the amplification circuitry consists of a two-stage, 20 decibel (dB) gain power amplifier driver. Notably, the bias circuitry and amplification circuitry may be incorporated in a single integrated circuit, separate circuits, or a combination of integrated discrete components. For the sake of conciseness and readability, the bias circuit shown in FIG. 2 is shown only controlling bias currents with respect to the RF input signal to be amplified. In operation, the bias circuitry may be combined with other circuitry that may impact bias control to compensate for temperature, gain or other operation aspect.

In operation, the bias circuitry senses the strength of the input signal to be amplified and converts it to a DC current. The DC current is then mirrored to form bias currents for one or more amplifiers or amplifier stages. Transistors Q1 and Q2 along with resistors R1 and R3 are configured to provide a minimum DC bias condition when the input signals are small. In this mode, the current flowing through transistor Q2 is small and the corresponding bias currents are also small. As the input signal increases in magnitude, transistor Q2 effectively amplifies and rectifies the input signal, and capacitor C2 and resistor R3 operate to filter the rectified input signal. The DC current flowing through transistor Q2 is directly proportional to the input signal level to be amplified.

In particular, transistor Q2 will conduct as the input signal received at the base cycles above the voltage appearing at the emitter of transistor Q2. If the input signal level surpasses the emitter voltage at transistor Q2, the transistor will conduct and charge capacitor C1 to a higher voltage. If the input signal level does not surpass a voltage sufficient to cause transistor Q2 to conduct, the emitter voltage held by capacitor C1 will discharge through resistor R3 until an input signal level surpasses the emitter voltage sufficient enough to turn on transistor Q2. Thus, transistor Q2 and the filter network composed of resistor R3 and C1 effectively rectify the input signal.

In addition to rectifying the input signal, transistor Q2 operates as an amplifier wherein the current through Q2 is set by the rectified voltage level appearing at the emitter and the value of resistor R3. As the emitter voltage increases, the amount of current through transistor Q2 increases. Transistor Q2 is supplied current via a PMOS transistor M1. The gate and source of transistor M1 are coupled to the collector of the PMOS transistor M1. Preferably, transistor M1 has a current gain ratio of 1. Thus, the current flowing through M1 is equal to the current flowing through transistor Q2.

Additional PMOS transistors M2 and M3 are coupled to transistors M1 and Q2 to form current mirrors, which proportionally mirror the current flowing through transistor M1. The current mirrors are configured to have current gains sufficient to appropriately bias the respective amplifier or amplifier stage to ensure linearity for the corresponding signal levels. In the embodiment shown in FIG. 2, if transistor M1 has a unity current gain, transistor M2 will provide a current gain of 15 times that flowing through transistor M1, and transistor M3 will have a current gain of 30 times that of transistor M1.

The gates of PMOS transistors M2 and M3 are coupled to the collector of transistor Q2 wherein the collector voltage of Q2 controls the current through each PMOS transistor M1, M2 and M3. The current through transistor M1 supplies the current for transistor Q2 and the current supplied by transistors M2 and M3 provide the respective bias currents IB1 and IB2. For example, if the DC current flowing through transistor Q2 is approximately 100 microamps, the current flowing through transistor M1 would also be 100 microamps, while the current flowing through transistors M2 and M3 would be 1.5 milliamps and 3.0 milliamps, respectively. Additional current mirrors and amplification stages may be added as necessary.

Resistor R4 and capacitor C2 may be used to adjust the sensitivity of the input to the bias circuitry and block DC. Adjusting the resistance of R4 will effectively adjust the transconductance of the bias circuitry.

Figure 3:
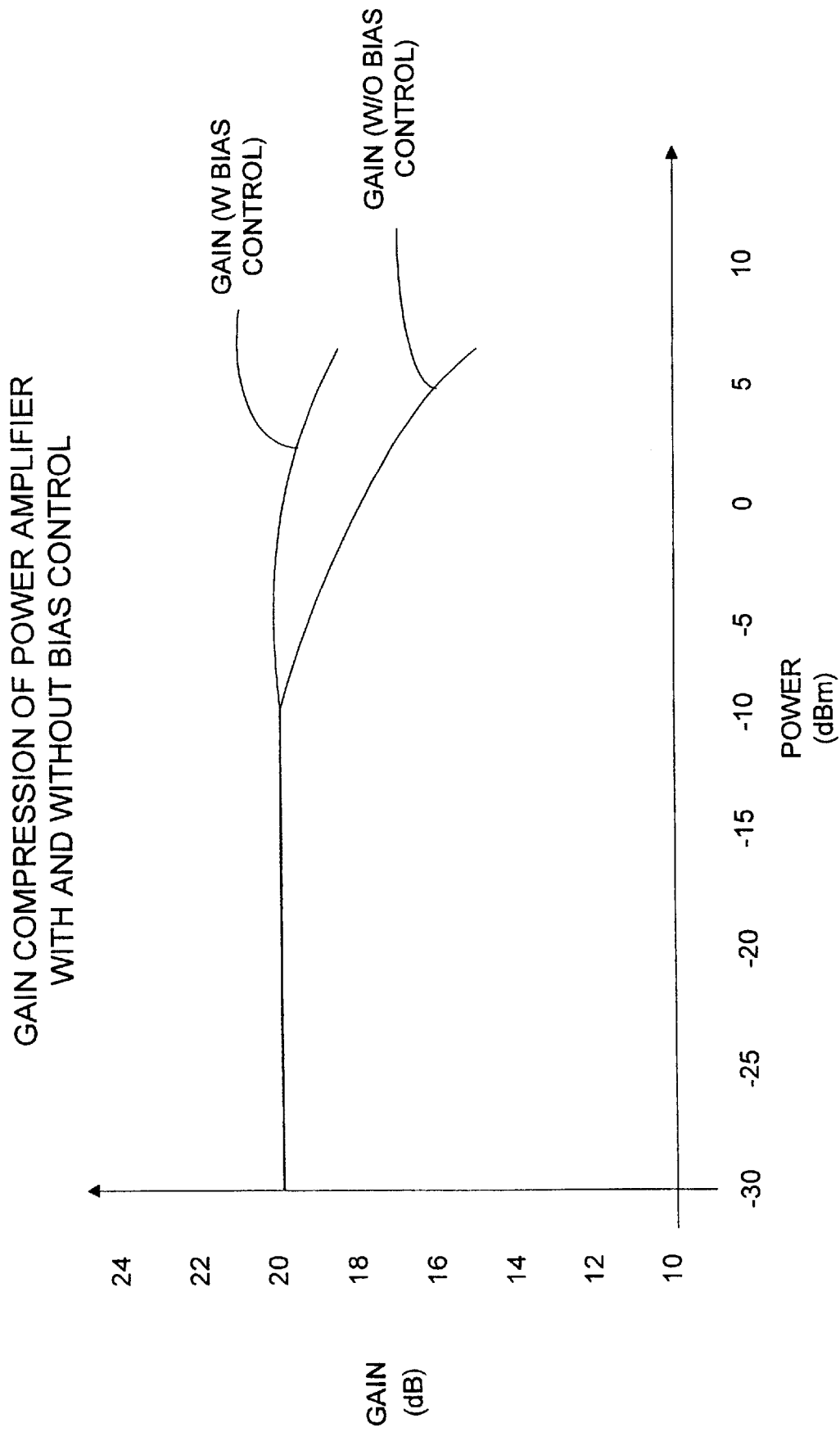
FIG. 3 is a graph of amplifier performance for an RF amplifier with and without biasing provided by the bias circuitry depicted in FIG. 2.
Figure 4:
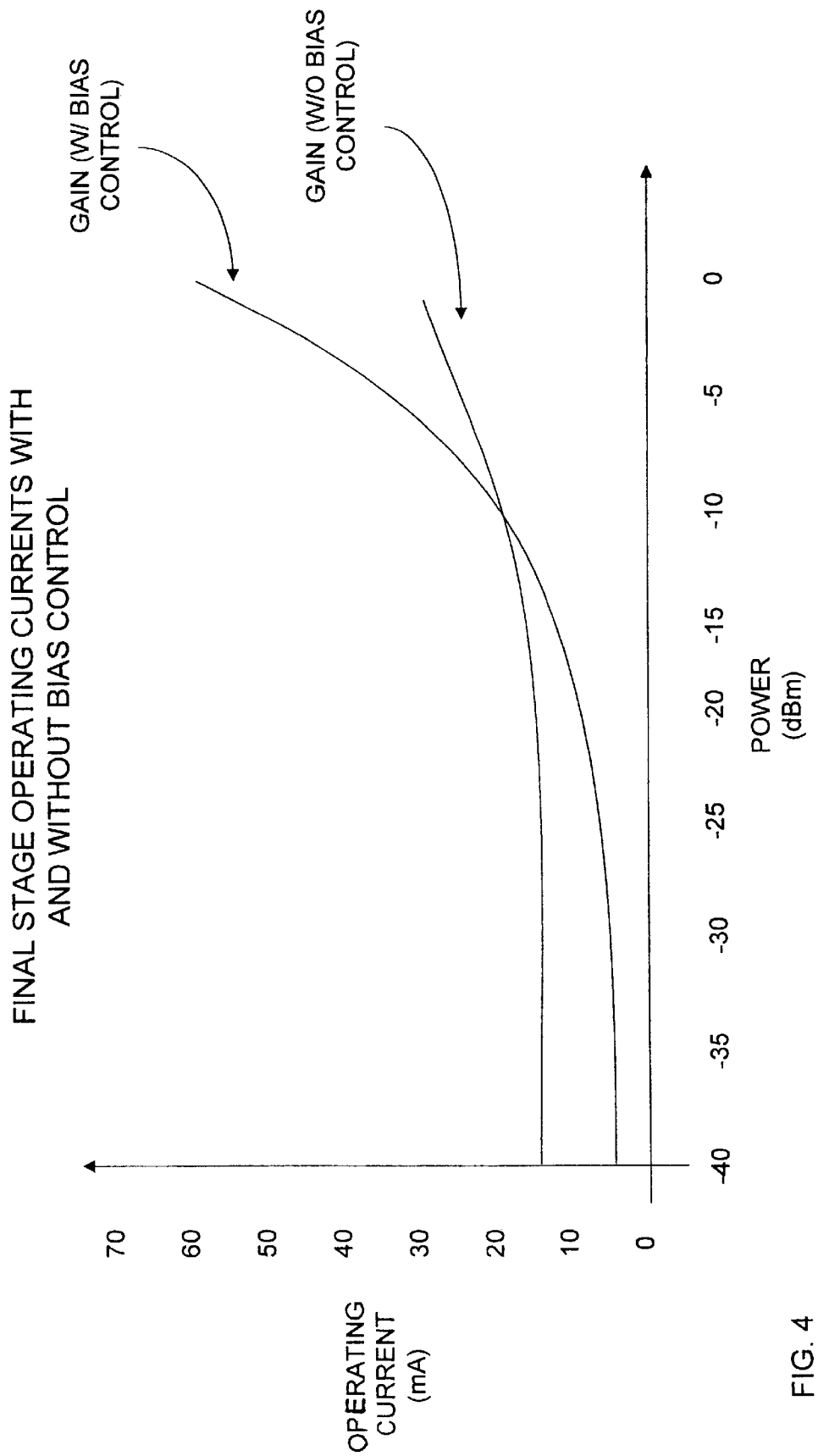
FIG. 4 is a graph of final stage collector currents for amplifier circuitry using bipolar technology with and without biasing provided by the bias circuitry depicted in FIG. 2.

The graph of FIG. 3 depicts the improved performance of a power amplifier when the bias control circuitry of the present invention is used to bias the power amplifier stages 102, 104. As is clearly shown, gain is linear over a wider operating range when the inventive circuitry is used. The graph of FIG. 4 depicts amplifier gain versus operating current of an amplifier stage with and without the biasing circuitry. Note there is significant power savings over most of the operating range and significant increases in gain at maximum operating levels. Under small signal conditions, quiescent currents are much lower when automatic bias control is provided. At the same time, the automatic bias control extends the linear operating range under large signal conditions. Testing of the preferred embodiment has shown that at low power levels, operating currents are cut approximately in half, which effectively doubles amplifier efficiency. At larger input power levels, bias currents are automatically increased past normal operating levels to allow a 6 dB increase in output power without compromising linearity.

Figure 5:
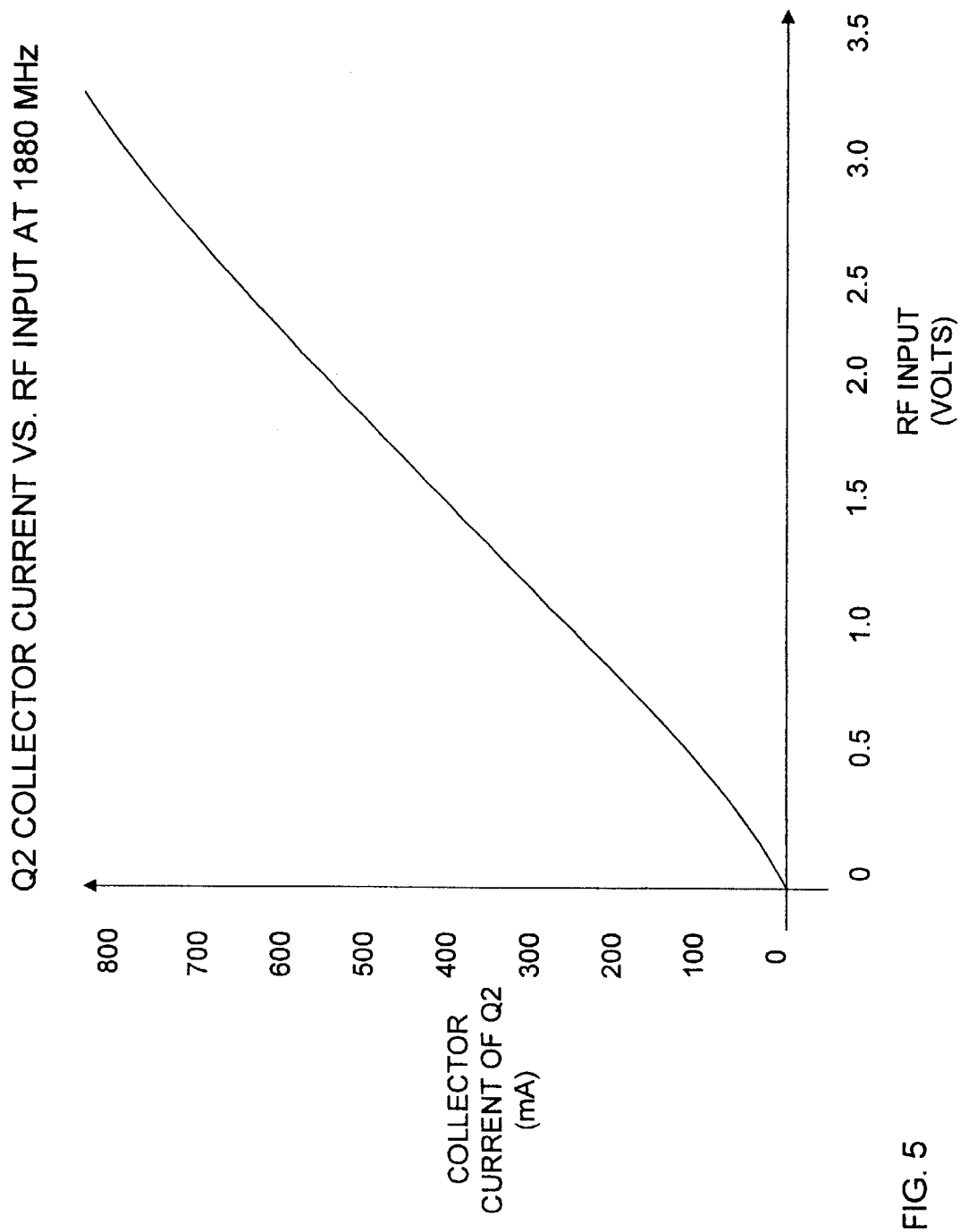
FIG. 5 is a graph of the collector current of transistor Q2 depicted in FIG. 2 versus an RF input signal to be amplified.

The graph of FIG. 5 shows the linear transfer function of the bias circuitry. As the RF input voltage is swept from 0 to 3 volts, the current flowing through transistor Q2 substantially, linearly sweeps from 18 microamps to 828 microamps. The linearity of the bias current generators, namely transistors M2 and M3 in the preferred embodiment, mirrors that of the current flowing through transistor Q2.

Certain modifications and improvements will occur to those skilled in the art upon reading the foregoing description. It should be understood that all such modifications and improvements have been deleted herein for the sake of conciseness and readability but are properly which the scope of the following claims.

What is claimed is:

1. A biasing circuit for use with a radio frequency power amplifier, said biasing circuit comprising:
   an input for receiving a radio frequency signal to be amplified by the radio frequency power amplifier;
   a first transistor circuit coupled to said input and adapted to provide a bias control current having a value proportional to a relative magnitude of the radio frequency signal to be amplified; and a second transistor circuit coupled to said first transistor circuit and adapted to output a bias current for the radio frequency power amplifier proportional to said bias control current based on mirroring said bias control current with a desired current gain;

wherein the magnitude of the radio frequency signal to be amplified by the radio frequency power amplifier is used to provide a proportional bias to the radio frequency power amplifier sufficient to insure substantially linear operation of the radio frequency power amplifier over varying levels of the radio frequency signal to be amplified.

2. The biasing circuit of claim 1 further comprising one or more additional transistor circuits coupled to said first transistor circuit, each adapted to output an additional bias current for use with one or more additional radio frequency power amplifiers successively arranged in an amplification signal path subsequent to the radio frequency power amplifier receiving the radio frequency signal to be amplified, wherein respective ones of said additional transistor circuits are matched to respective ones of the one or more additional radio frequency power amplifiers and configured with increasing current gains such that each successive radio frequency power amplifier in the amplification signal path receives a bias current proportionately larger than an immediately preceding radio frequency power in the amplification signal path.

3. The biasing circuit of claim 1 wherein said first transistor circuit is implemented using one or more bipolar junction transistors and said second transistor circuit is implemented using one or more field effect transistors.

4. The biasing circuit of claim 3 wherein said first and second transistor circuits are implemented in an integrated circuit device employing BiCMOS technology.

5. The biasing circuit of claim 1 wherein said biasing circuit is included in an integrated circuit device.

6. The biasing circuit of claim 5 wherein said integrated device includes the radio frequency power amplifier.

7. The biasing circuit of claim 6 wherein the radio frequency power amplifier is implemented using heterojunction bipolar transistors.

8. An integrated circuit device adapted to provide bias currents to one or more radio frequency power amplifiers in an amplification signal path, said integrated circuit device comprising:

an input for receiving a radio frequency signal to be amplified by the one or more radio frequency power amplifiers;

a level sensing circuit coupled to said input and adapted to provide a bias control signal proportional to a relative magnitude of the radio frequency signal to be amplified; and a biasing circuit coupled to said level sensing circuit and adapted to output bias currents to the one or more radio frequency power amplifiers, each said bias current proportional to said bias control signal, and said biasing circuit configured to scale said bias currents such that each successive radio frequency power amplifier in the amplification signal path receives a proportionately larger bias current.

9. The integrated circuit device of claim 8 further comprising a filter network disposed between said input and said level sensing circuit and adapted to provide said level sensing circuit with a filtered portion of the radio frequency signal to be amplified as received through said input.

10. The integrated circuit device of claim 8 wherein said level sensing circuit is a bipolar junction transistor circuit.

11. The integrated circuit device of claim 8 wherein said biasing circuit is a field effect transistor circuit.

12. The integrated circuit device of claim 8 further comprising the one or more radio frequency power amplifiers in the amplification signal path.

13. A biasing circuit for use with a radio frequency power amplifier, said biasing circuit comprising:

an input for receiving a radio frequency signal to be amplified by the radio frequency power amplifier;

level sensing circuitry comprising a filter circuit coupled to said input and a first transistor circuit coupled to said filter circuit and adapted to provide a bias control signal having a value proportional to a relative magnitude of the radio frequency signal to be amplified; and biasing circuitry comprising a second transistor circuit coupled to said first transistor circuit and adapted to output a bias current to the radio frequency power amplifier that is proportional to said bias control signal;

wherein said level sensing circuitry substantially rectifies a radio frequency signal to be amplified by the radio frequency power amplifier to generate a substantially DC bias control signal that is proportional to a relative magnitude of the radio frequency signal to be amplified, such that said bias current output by said biasing circuitry is a DC bias current signal having a magnitude proportional to the relative magnitude of the radio frequency signal to be amplified.

14. The biasing circuit of claim 13 wherein said biasing circuitry further comprises one or more additional transistor circuits coupled to said first transistor circuit, each said additional transistor circuit adapted to output a bias current proportional to said bias control signal to additional radio frequency power amplifiers, wherein the additional radio frequency power amplifiers are successively arranged in an amplification signal path after the radio frequency amplifier receiving the radio frequency signal to be amplified.

15. The biasing circuit of claim 14 wherein said additional transistor circuits correspond to respective ones of the additional radio frequency power amplifiers, and further wherein each one of said additional transistor circuits is configured with a current gain based on a position in the amplification signal path of the respective additional radio frequency power amplifier.

16. The biasing circuit of claim 13 wherein said level sensing circuitry primarily comprises a bipolar junction transistor and said biasing circuitry primarily comprises a field effect transistor.

17. The biasing circuit of claim 13 wherein said bias control signal is an analog current signal, and further wherein said biasing circuitry mirrors said bias control signal with a desired current gain to produce said bias current.

18. A biasing circuit for use with multiple radio frequency power amplifier stages successively arranged in an amplification signal path, said biasing circuit comprising:

an input for receiving a portion of a radio frequency signal to be amplified by the multiple radio frequency power amplifiers in the amplification signal path;

a filter circuit coupled to said input and adapted to pass a desired range of signal frequencies within the radio frequency signal to be amplified;

a first transistor circuit coupled to said filter circuit and adapted to output a bias control current based on receiving a filtered portion of the radio frequency signal to be amplified through said filter circuit; and a biasing transistor network coupled to said first transistor circuit and adapted to output multiple bias currents for biasing the multiple radio frequency power amplifiers based on mirroring said bias control current with a different current gain for each one of said multiple bias currents;

wherein the current gain for a given one of said multiple bias currents is configured based on a maximum signal amplitude expected for a corresponding one of the multiple radio frequency power amplifier stages, such that each successive radio frequency power amplifier stage receives a proportionately larger bias current from said biasing circuit.

19. The biasing circuit of claim 18 wherein said biasing circuit comprises a portion of an integrated circuit device.

20. The biasing circuit of claim 18 wherein said first transistor circuit primarily comprises a bipolar junction transistor arranged such that a base current is received into a base of said bipolar junction transistor through said filter circuit, and wherein said bipolar junction transistor is biased such that a collector current into a collector of said bipolar junction transistor is proportional to said base current.

21. The biasing circuit of claim 18 wherein said biasing transistor network comprises a plurality of field effect transistors, each one of said field effect transistors providing a bias current to a corresponding one of the multiple radio frequency power amplifier stages.

22. A method of biasing a first radio frequency power amplifier, said method comprising:

sensing a relative magnitude of a radio frequency signal to be amplified by the first radio frequency power amplifier;

generating a control current proportional to the relative magnitude of the radio frequency signal to be amplified;

mirroring the control current with a first desired current gain to produce a bias current proportional to said control current;

wherein said bias current is configured with the desired current gain based on a maximum expected signal amplitude of the radio frequency signal to be amplified, and wherein said bias current varies with the relative magnitude of the radio frequency signal to be amplified such that the first radio frequency power amplifier operates in a substantially linear mode across a range of relative magnitudes of the radio frequency signal to be amplified.

23. The method of claim 22 further comprising:

mirroring said control current with successively larger current gains scaled relative to said first current gain to produce a plurality of additional bias currents; and biasing respective ones of a corresponding plurality of additional radio frequency power amplifiers successively arranged in an amplification signal path subsequent to said first radio frequency power amplifier with respective ones of said plurality of additional bias currents, such that each successive additional radio frequency power amplifier receives a proportionately larger bias current.

24. The method of claim 22 wherein said sensing a relative magnitude of a radio frequency signal to be amplified by the first radio frequency power amplifier comprises:

filtering the radio frequency signal to be amplified to produce a filtered signal;

rectifying the filtered signal to produce a DC signal; and biasing a transistor control circuit with said DC signal such that said transistor control circuit produces a bias control current proportional to the relative magnitude of the radio frequency signal to be amplified.

25. The method of claim 22 wherein said mirroring the control current with a first desired current gain to produce a bias current proportional to said control current comprises configuring a field effect transistor to provide said bias current proportional to said bias control signal based on controlling a gate voltage of said field effect transistor with said bias control current.

* * * * *